(12) United States Patent
Moresco et al.

(10) Patent No.: US 6,539,137 B1
(45) Date of Patent: Mar. 25, 2003

(54) THERMO-ELECTRIC SIGNAL COUPLER

(75) Inventors: Larry L. Moresco, San Carlos, CA (US); Vivek Mansingh, Saratoga, CA (US); Teruo Murase, Yokohama (JP)

(73) Assignee: Fujitsu Limited (JP)

(*) Notice: Subject to any disclaimer, the term of this patent is extended or adjusted under 35 U.S.C. 154(b) by 0 days.

(21) Appl. No.: 09/520,545

(22) Filed: Mar. 8, 2000

(51) Int. Cl.⁷ .................. G02B 6/12; G01J 5/20
(52) U.S. Cl. .................. 385/14; 385/1; 385/2; 385/4; 385/8; 385/15; 385/31; 385/129; 385/130; 250/338.3
(58) Field of Search ............ 250/338.3; 385/14, 385/1, 2, 4, 5, 8, 15, 31, 39, 129, 130, 131, 147

(56) References Cited

U.S. PATENT DOCUMENTS

| | | | | |
|---|---|---|---|---|
| 3,245,011 A | | 4/1966 | Rupprecht | 333/31 |
| 3,543,248 A | | 11/1970 | Oliver | 340/173 |
| 3,609,713 A | | 9/1971 | Wooton et al. | 340/173 |
| 3,809,908 A | | 5/1974 | Clanton | 250/217 |
| 3,985,685 A | | 10/1976 | Houlton et al. | 252/521 |
| 4,300,047 A | * | 11/1981 | Fujii et al. | 250/330 |
| 4,375,053 A | | 2/1983 | Viola et al. | 333/116 |
| 4,451,710 A | | 5/1984 | Taylor et al. | 179/110 |
| 4,494,083 A | | 1/1985 | Josefsson et al. | 333/33 |
| 4,536,725 A | | 8/1985 | Hübler | 333/204 |
| 4,906,849 A | * | 3/1990 | Duo et al. | 250/338.3 |
| 4,950,897 A | * | 8/1990 | Mandelis et al. | 250/334 |
| 4,956,554 A | * | 9/1990 | Baker et al. | 250/338.3 |
| 4,982,093 A | * | 1/1991 | Voles | 250/332 |
| 5,073,761 A | | 12/1991 | Waterman et al. | 333/24 |
| 5,099,214 A | | 3/1992 | Rosen et al. | 333/157 |
| 5,116,807 A | | 5/1992 | Romanofsky et al. | 505/1 |
| 5,122,666 A | * | 6/1992 | Turnbull | 250/338.3 |
| 5,126,718 A | * | 6/1992 | Doctor | 340/567 |
| 5,212,462 A | | 5/1993 | Gomez-Henry et al. | 333/136 |
| 5,237,434 A | | 8/1993 | Feldman et al. | 359/19 |
| 5,293,041 A | * | 3/1994 | Kruse, Jr. | 250/338.3 |
| 5,311,019 A | * | 5/1994 | Gammarino | 250/338.3 |
| 5,589,687 A | * | 12/1996 | Kawata et al. | 250/338.3 |
| 5,602,043 A | * | 2/1997 | Beratan et al. | 438/54 |
| 5,929,441 A | * | 7/1999 | Beratan et al. | 250/338.3 |
| 5,949,071 A | * | 9/1999 | Ruffner et al. | 250/338.3 |
| 5,972,108 A | * | 10/1999 | Beratan et al. | 117/84 |
| 6,031,231 A | * | 2/2000 | Kimata et al. | 250/332 |
| 6,245,439 B1 | * | 6/2001 | Yamada et al. | 264/109 |

FOREIGN PATENT DOCUMENTS

EP            0252669 A2 *  1/1988 ............ C09D/3/78

* cited by examiner

*Primary Examiner*—Brian Healy
(74) *Attorney, Agent, or Firm*—Coudert Brothers LLP

(57) ABSTRACT

A signal coupler is comprised of a transmitting section and a receiving section. The receiving section includes a polymer pyroelectric film element having a greater than 1% by volume of a high thermal diffusivity material, such as aluminum nitride, to improve the thermal diffusivity of the polymer film. A preferred embodiment of the transmitting section includes a thin film resistive heater to generate thermal pulses which are coupled to the receiving section by a thin film of thermal grease disposed between the receiving section and the transmitting section.

15 Claims, 6 Drawing Sheets

THERMO-ELECTRIC SIGNAL COUPLER

FIELD OF THE INVENTION

The present invention relates generally to signal coupling devices. More particularly, the present invention is directed to a signal coupler which transmits information in the form of heat pulses which are received by a pyroelectric detector.

BACKGROUND OF THE INVENTION

There are numerous well-known techniques in the electronic packaging and interconnection art to form high-speed (e.g, 1 MHz to 1 GHz) data communication links between two electronic circuit boards, substrates, packaging layers, circuit elements or the like. This problem may be described in respect to the particular packaging problem of coupling electronic data signals between two circuit boards, although it will be understood that many of the same considerations apply to the signal coupling problems associated with other types of electronic packaging.

The most common way to form high-speed data links between two circuit boards is to form data transmission lines and signal contact pads on each circuit board. Low resistance bonds between the signal contact pads of the two boards are formed using solder bonds or conductive epoxy bonds. One drawback of conventional bonding processes used to interconnect two circuit boards is that the parasitic electrical resistance increases rapidly as the area of the contact pads decreases. Typically, signal contact pads must have a diameter of greater than about 100 microns in order to maintain a low contact resistance. Another drawback is that solder and epoxy bond connections are relatively permanent, i.e., it is typically not possible to cheaply, reliably, and quickly remove the two boards after the permanent conductive joints have been formed.

The electronics art also includes detachable mechanical signal connectors for forming a removable electrical connection between two different circuit boards or substrates. Commonly, these connectors comprise female electrical sockets on a first board designed to mate with complementary male elements disposed on a second board. Conventional male/female connectors have many drawbacks. One drawback is that the sockets increase the electrical resistance and add a parasitic inductance. The parasitic electrical resistance and inductance of the connector may limit the rate at which data can be communicated. Another drawback is that male/female connectors tend to have a substantial size compared to the circuit boards themselves. Still another drawback is that it is difficult to form a reliable male/female connection as the contact area of the male/female elements is reduced. A direct pressure contact between two electrical contact surfaces often results in only a fraction of the metallic surfaces forming an electrical conductive pathway for the flow of current, resulting in a high contact resistance. This problem is particularly severe as the male/female connector is miniaturized. Consequently, it is difficult to form a high density of electrical interconnections using male/female sockets.

Conventional means for interconnecting two circuit boards do not permit a compact, high speed, removable signal coupler to be achieved. This limits the ability of circuit designers and packaging engineers to test, assemble, or disassemble signal data links between circuit boards, substrates, and multi-chip modules.

What is desired is a compact, removable, low stress signal coupler for forming a data communication link between two circuit boards, substrates, or the like.

SUMMARY OF THE INVENTION

The present invention is a signal coupler for transmitting data signals between two substrates, circuit boards, or the like, which utilizes the pyroelectric effect. A transmitting section of the signal coupler generates thermal pulses in the pyroelectric detector element of a receiving section, thereby communicating data signals.

The receiving section of the present invention generally includes: a support layer; a pyroelectric film disposed on a surface of the support layer, the pyroelectric film having first and second opposed film surfaces; a thermally conductive member disposed in the support layer coupled to said pyroelectric film; first and second electrical contacts coupled to the pyroelectric film configured to couple an electrical output signal from the pyroelectric film; wherein the pyroelectric film is composed of a pyroelectric polymer having a greater than about 1% by volume of a high thermal dipuffusivity electrically insulating material so that the pyroelectric film has a thermal diffusivity at least ten times greater than the thermal diffusivity of the bulk polymer. In a preferred embodiment, the support layer is disposed on a thermally conductive substrate and the pyroelectric film is a pyroelectric film element which has a thickness less than about 200 nanometers.

The transmitting section of the present invention includes a substrate having an energy source configured to generate thermal pulses which are received by the pyroelectric film element of the receiving section. In a preferred embodiment, the energy source is a thin film resistive heating element disposed on a thermally insulating portion of a substrate. Heat pulses generated by the resistive heating element are thermally conducted to the pyroelectric film element of the receiving section by a thermally conductive film, preferably a thin film of thermal grease. In an alternate embodiment, the thermal energy source is a semiconductor laser which generates infrared laser pulses which are received as heat puls pyroelectric film element.

One object of the present invention is to provide a low contact pressure signal coupler which is removable and which does not require permanent mechanical bonds to be made between the transmitting and receiving sections of the signal coupler.

Another object of the present invention is a receiving section with a pyroelectric film element which is capable of receiving data at rates in excess of one million bits per second.

Still another object of the- present invention is transmitting section which efficiently generates thermal pulses in the receiving section.

These and other objects of the present invention will become apparent to those skilled in the art from the following detailed description and from the detailed drawings.

DETAILED DESCRIPTION OF THE INVENTION

The present invention generally comprises an apparatus and method to couple data signals between two substrates using the pyroelectric effect. The inventive apparatus comprises a high-speed signal coupler specifically designed to transmit information in the form of digital pulses between two substrates in close proximity to each other in a low-contact pressure or no-contact pressure configuration.

Figure 1A:
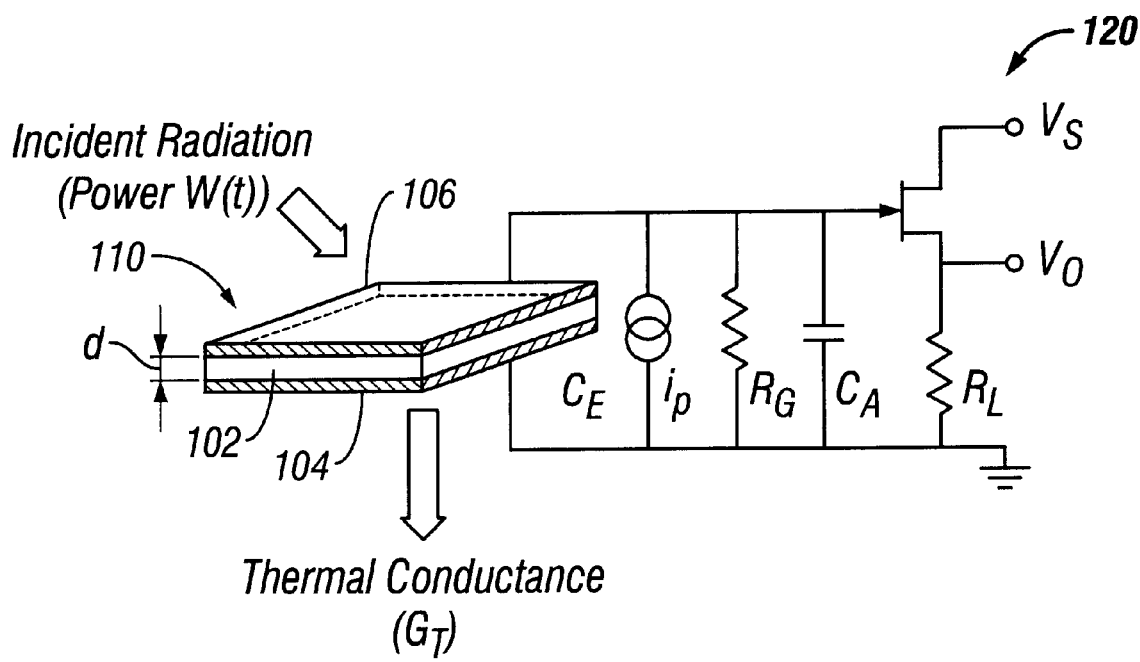
FIG. 1A is an illustrative diagram of a prior art pyroelectric detector.
Figure 1B:
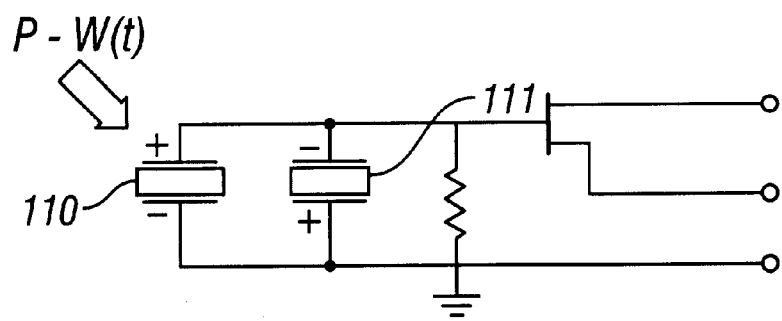
FIG. 1B is a prior art schematic circuit diagram illustrating how a second pyroelectric detector may be used as a differential pair to cancel out the effect of background temperature fluctuations.
Figure 2:
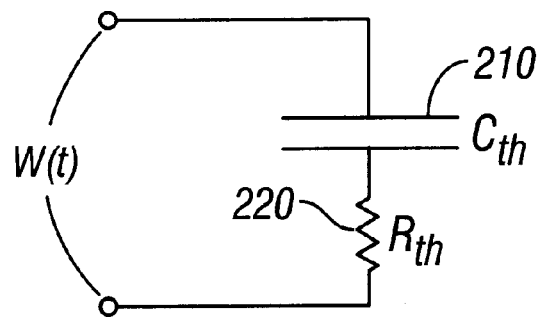
FIG. 2 shows an equivalent thermal circuit of the detector of FIG. 1A.

The general principles and limitations of conventional pyroelectric detectors are illustrated in FIGS. 1–2, which are prior art detectors used in motion sensors and imaging arrays. FIG. 1A is a prior art pyroelectric detector 10 illustrating the general principles of a conventional pyroelectric detector. Referring to FIG. 1A, a conventional pyroelectric element 110 receives incident infrared radiation with an absorbed power, W(t). The incident infrared radiation may be absorbed in the pyroelectric material 102 itself or in absorbing layers proximate first and second electrodes 104, 106. First and second electrodes 104, 106 may comprise have openings to permit radiation to reach the pyroelectric material 102 or may be sufficiently thin to permit the penetration of infrared radiation into the body of the detector 110. The absorbed infrared radiation W(t) increases the temperature of the pyroelectric material 102. The effect of a change in temperature of a pyroelectric material 102 is to cause an electric current to flow in an external circuit 120. A pyroelectric material is commonly defined as a polar dielectric material in which the internal dipole moment of the material is temperature dependent. When the temperature of a pyroelectric material varies there is a change in the charge balance at the surface of the material. This change in charge balance can be detected as either a potential difference or as a charge flowing in an external circuit.

Typically, a pyroelectric detector is configured to produce an output current. The pyroelectric current, $i_p$ is given by the mathematical relationship: $i_p = Ap\, dT/dt$, where A is the area of the pyroelectric material 102, p is the component of the pyroelectric coefficient normal to the electrodes 104, 106, and dT/dt is the time rate of change of temperature of the pyroelectric material 102. While increasing the area of the detector increases the pyroelectric current, it also increases the thermal mass of the detector, which reduces the differential rate of temperature change for an infrared input signal W(t) of constant magnitude. As indicated in FIG. 1A, pyroelectric detector 110 is coupled to a heat sink (not shown in FIG. 1A) with a thermal conductance $G_T$. The differential rate of temperature change of pyroelectric detector 110 to an infrared input signal W(t) of constant magnitude will depend upon the thermal mass and thermal conductance of the detector 110.

As shown in FIG. 1A, the pyroelectric detector 110 is typically coupled to an external circuit 120 comprising electrical amplification and isolation elements, such as a field effect transistor, to generate an output voltage, $V_o$. Commercially available lithium tantalate crystal pyroelectric detectors typically have an area of several square millimeters, although the required area will depend upon the material comprising the pyroelectric detector and the particular application. Since the pyroelectric current is typically small, it is desirable to eliminate noise. A common practice, as indicated in FIG. 1B, is to use an additional pyroelectric detector 111, that does not receive the input infrared radiation W(t), which is configured to produce a current which cancels out signals associated with local changes in the temperature of the heat sink.

FIG. 2 shows a lumped thermal model of a conventional pyroelectric detector. A conventional pyroelectric detector is limited to a slow modulation rate by its thermal mass and other design factors. To a first order approximation, a conventional pyroelectric detector can be modeled as a thermal capacitance 210 coupled to a heat sink by a thermal resistance 220. The response of a pyroelectric detector may be calculated from first principles. Conventional pyroelectric detectors have a high sensitivity only at comparatively low modulation frequencies in the range of about 0.1 to 100 Hz. See, e.g, Roger W. Whatmore, *Pyroelectric Materials And Devices*, pp. 1126–1131 in *The Electrical Engineering Handbook*, ed. Richard C. Dorf, CRC Press (1993). For modulation rates in excess of about 1 kHz the sensitivity is extremely low such that only high energy pulses (e.g., gas laser pulses) may be resolved.

Figure 3:
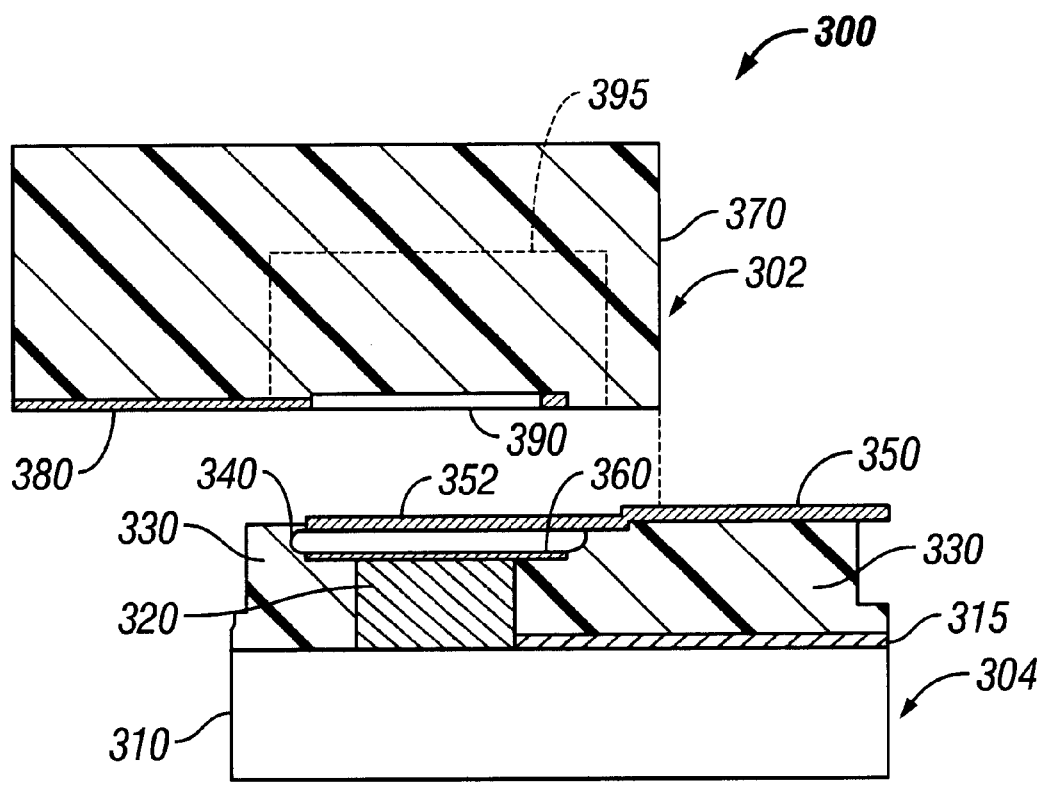
FIG. 3 is a side view showing the transmitting and receiving sections of a first embodiment of the signal coupler of the present invention.

The inventors of the present invention have recognized that pyroelectric detectors may be designed to have a high sensitivity at data rates far in excess of 1 kHz, enabling pyroelectric detectors to be used in high speed signal couplers. FIG. 3 is a cross-sectional side view of a first embodiment of the high data rate signal coupler 300 of the present invention showing a data transmitting section 302 and a data receiving section 304. Data transmitting section 302 and data receiving section 304 are preferably separate physical elements which are not rigidly attached to each other. However, it will be understood by those of ordinary skill in the art that data transmitting section 302 and data receiving section 304 may be rigidly attached to each other by permanently bonding or otherwise attaching sections 302, 304 to each other.

Data receiving section 304 comprises a thermally conductive substrate 310. A thermally insulating support layer 330 is attached to the surface of first substrate 310. Thermally insulating support layer 330 is preferably an electrical insulator. A pyroelectric film element 340 is disposed proximate an outer surface of the insulating support layer 330. Pyroelectric film element 340 is a section (e.g., patterned area) of a polymer film. The polymer film preferably has a thickness which is less than about two microns. First and second electrodes 352, 360 are disposed on opposite sides of the pyroelectric film element 340. A thermally conductive heat sink thermal member 320 is disposed in support layer 330 and thermally couples pyroelectric film element 340 to thermally conductive substrate 310. Thermal member 320 is preferably also an electrical conductor, since this facilitates making an electrical connection 315 to second electrode 360 via thermal member 320, as shown in FIG. 3. Also, as shown in FIG. 3 and additional low resistance contact is preferably configured to make a low resistance, high speed electrical connection to first electrode 352.

Data transmitting section 302 comprises a second substrate 370. Second substrate 370 may comprise a thermally insulating substrate or a thermally conductive substrate. Electrical contact 380 is configured to provide a drive current to a thermal energy source 390. Thermal energy source 390 is configured to heat the pyroelectric film element 340 in the assembled coupler 300. In the preferred embodiment of FIG. 3, thermal energy source 390 is a thin film resistive heater disposed proximate the outer surface of second substrate 370. The area of the thin film resistive heater is also selected to be small such that the thin film resistive heater is a microheater having a small thermal mass. A portion of substrate 370 adjacent resistive heater 390 is preferably comprised of a thermally insulating region 395 (shown in phantom in FIG. 3) to reduce the flow of heat into second substrate 370. In the preferred embodiment, the small thermal mass of the thin film micro-heater 390 facilitates generating short duration thermal pulses using comparatively small currents.

Mechanical alignment pins or other well-known mechanical couplers (not show in FIG. 3) may be used to maintain the sections 302, 304 of the signal coupler 300 in proper alignment. A thin film of a thermally conductive material (not shown in FIG. 3), preferably a thin film (e.g., on the order of 1 micron in thickness) of thermally conductive grease, may be used to thermally couple transmitting section 302 to receiving section 304 in the assembled coupler 300. Thermal grease is a term of art generally used to refer to viscous fluids, such as a silicone oil or gel, with a high thermal conductivity. Typically the thermal conductivity of a thermal grease is increased by the addition of a small percentage by volume of a good thermal conductor, such as boron nitride.

The use of a thermally conductive thin film to couple heat pulses generated in thin film resistive micro-heater 390 disposed in transmitting section 302 to pyroelectric film element 340 disposed in receiving section 302 enables comparatively low energy thermal energy pulses to rapidly propagate from resistive heater 390 to pyroelectric film element 340 via thermal conduction. A thermally conductive channel is formed by the thermal grease to conduct heat pulses from the resistive heater 390 to pyroelectric film element 340. Heat pulses generated in resistive heater 390 have a short propagation distance (e.g., through one micron of thermal grease) to reach pyroelectric film element 340. Moreover, there is a relatively short thermal dissipation path from pyroelectric film element 340 to the thermally conducting substrate via thermal member 320.

While FIG. 3 shows one particular configuration of electrical connections 380, 360, 315, 350 it will be understood by those of ordinary skill in the art that at high data rates high speed electrical connections are required to efficiently couple current into a resistive heater 390 and to couple a signal from pyroelectric film element 340. A preferred high speed electrical connection is a microstrip line which is composed of opposed input and output conductive paths separated by a layer of insulation. For example, electrical connection 315 and electrical contact 350 may be configured to form a microstrip line for coupling signals from pyroelectric film element 340. Similarly, electric contact 380 may be configured to form a microstrip line to drive resistive heater 390 using any conventional microstrip line configuration.

Figure 4:
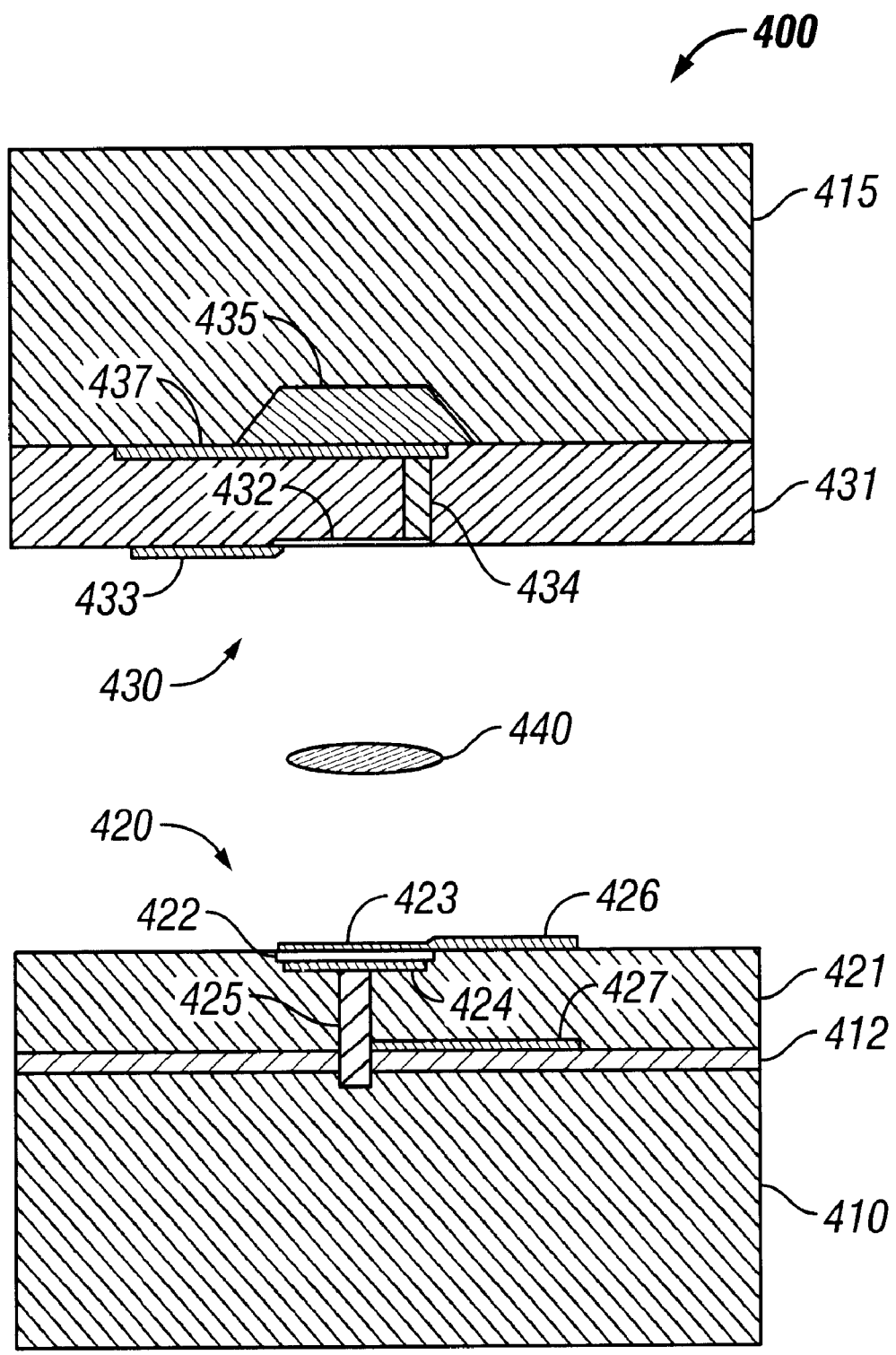
FIG. 4 is an exploded side view of a preferred embodiment of the signal coupler of FIG. 3.

FIG. 4 shows a side view of a 400 embodiment 400 of signal coupler 300 of the present invention fabricated with conventional semiconductor packaging techniques for depositing and patterning thin films of materials. The preferred embodiment is consistent with a low cost silicon fabrication process and result in the formation of high speed microstrip lines. As shown in FIG. 4, the transmitting section 430 is formed on a substrate 415, which is preferably an undoped silicon substrate. A first electrode 437 is deposited on substrate 415. An electrically and thermally insulating support layer 431,such as polyamide or spin-on glass, is deposited over first electrode 437. A preferred thickness of support layer 431 is about ten microns. An electrical via 434 is formed in support layer 431 to couple first electrode 437 to a thin film heating element 432 disposed proximate the outer surface of support layer 431. Thin film heating element 432 is preferably a chrome silicon oxide (Cr—Si—Ox) resistor. The thickness of thin film heating element 432 is preferably in the range of about 100 to 500 nanometers. A preferred area is about 50 microns by 50 microns, corresponding to an electrical resistance of about 500 to 2500 ohms for a Cr—Si—Ox thin film resistor 100 to 500 nanometers thick, depending upon the thickness of the film. As can be seen in FIG. 4, a second electrical contact 433 is configured to complete the electrical circuit to thin film resistor 432. A variety of thermally insulating materials may be used, such as silicon nitride or silicon dioxide, to form a thermally insulating region 435 in the substrate proximate thin film heating element 432 to limit the flow of heat into substrate 415. The techniques which may be used to fabricate insulating region 435 are conventional.

As shown in FIG. 4, receiving section 420 is preferably formed on a thermally conductive substrate 410, which is also preferably a silicon substrate. A second thermally insulating layer 412 is preferably deposited on the surface of second substrate 410. Suitable insulating materials include silicon nitride and silicon dioxide. A third electrode 427 is formed on the surface of the second insulating layer 412. A third thermally insulating layer 421 is deposited on the substrate 410 as a support layer. Third insulating layer 421 is preferably an electrically and thermally insulating film with a thickness of about ten microns. An electrically and thermally conductive member 425 is formed using conventional via or post forming methods. A first detector electrode 424 is deposited, electrically coupled to thermal member 425. A thin pyroelectric layer 422 is formed into on electrode 424. Top electrodes 423, 426 are then deposited to complete the pyroelectric detector electrodes. Top electrodes 423, 426 preferably comprise an electrode 423 coupled to the pyroelectric film element 422 and a low resistance conduction path 426 (e.g., a microstrip line). Top electrode 423 may comprise an annular ring and/or a thin film of conductive metal in accord with the standard practice of pyroelectric detectors. The surface onto which the pyroelectric layer is deposited is preferably a substantially planar layer so that the thickness of the pyroelectric film element 422 may be reduced white maintaining a continuous film. Polymer pyroelectric films may be deposited as liquid resins. As with other thin liquid films deposited using semiconductor packaging processing techniques, planarity of the surface is important in order to achieve a uniform deposited film thickness as the thickness of the film is reduced.

Figure 5:
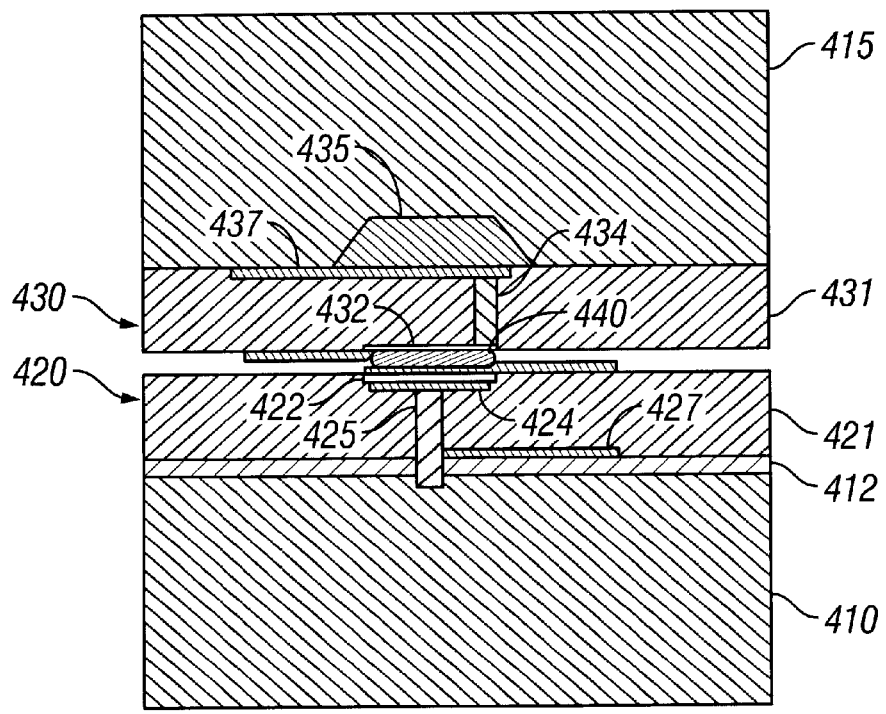
FIG. 5 shows the assembled coupler of FIG. 4.
Figure 6:
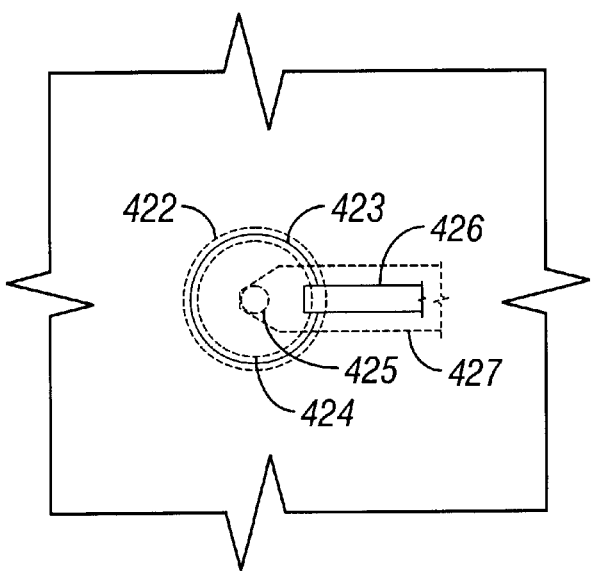
FIG. 6 is a top view showing a portion of the electrodes of the coupler of FIG. 4.

As shown in FIG. 4, a small quantity of thermal grease 440 is preferably used as a thermally conductive film to increase the thermal conductivity between transmitter section 430 and receiver section 420. FIG. 5 shows the assembled coupler of FIG. 4. FIG. 6 is a top view showing in phantom the outlines of portion of the electrode metallization layers.

Figure 7:
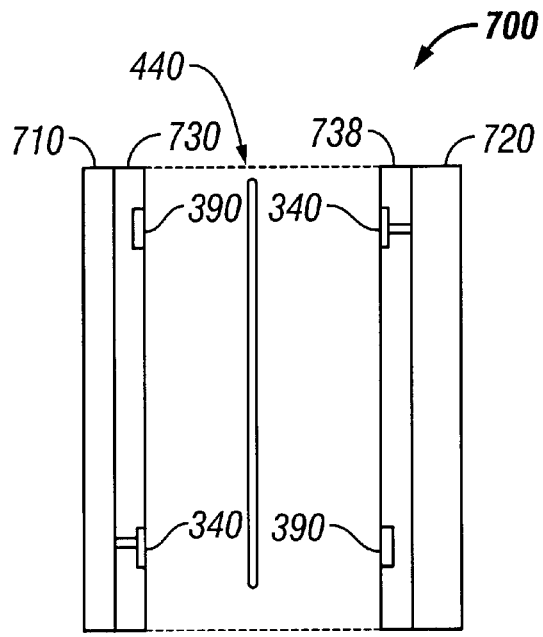
FIG. 7 is an exploded side view drawing, showing how a plurality of data communication channels may be implemented in the embodiment of FIG. 3.

It will be understood that the embodiments of FIGS. 4–6 may be extended to encompass a plurality of data communication channels, i.e., one or more pyroelectric detectors and one or more thermal transmitters on each substrate configured to communicate data with corresponding transmitters and detectors on an opposed substrate. FIG. 7 is an exploded side view drawing showing a plurality of pyroelectric detectors 340 and resistive micro-heaters 390 formed on support layers 730, 738 of two substrates 710, 720. For the purposes of illustration, electrical contact layers are not shown in FIG. 7. A layer of thermal grease 440 is used to thermally couple one pyroelectric detector 340 to one resistive heater 390 on opposed substrates 710, 720 to form a plurality of data channels in the assembled signal coupler. The individual elements are preferably spaced far enough apart to prevent deleterious thermal or electrical cross-talk between the parallel data communication channels.

Figure 8:
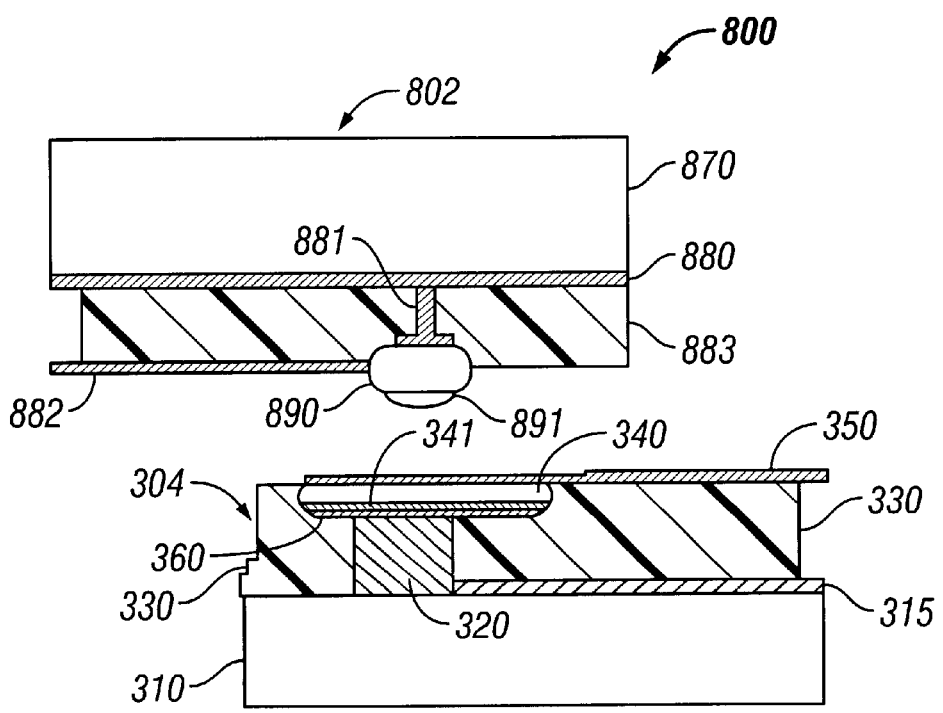
FIG. 8 is side view showing a second embodiment, similar to that of FIG. 3 except using a semiconductor laser as the heat source.

FIG. 8 shows an alternate embodiment of the present invention, similar to that shown in FIG. 3 but using a semiconductor laser 880 as the heat source. Receiving section 304 is similar to that of FIG. 3 except that it preferably contains an additional infrared absorbing layer 341 selected to absorb infrared radiation at the emission wavelength of the semiconductor laser source. Transmitting section 802 comprises a substrate 870, an electrically insulating support layer 883 deposited on the substrate 870, a semiconductor laser 890 disposed on the outer surface of support layer 883, and electrical contact layers 880, 882 and a via 881 configured to form electrical connections to laser 890. Output window 891 of laser 890 is directed to send a laser beam to pyroelectric detector element 340. Coupling of infrared radiation from laser 891 to pyroelectric detector element 340 may be achieved by bringing the output window 891 of laser 890 into close proximity to the surface of the detector element 340. However, if desired an optical glue or a transparent optical gel may be used as an optical interface layer between the transmitter section 802 and the receiver section 302.

Semiconductor lasers, such as gallium arsenide and indium phosphide lasers are efficient sources of visible and infrared radiation, particularly in the 0.6 to 1.8 micron wavelength region of the electromagnetic spectrum. Semiconductor lasers in this wavelength range are commonly used in optical recording and fiber optic communication systems. However, many common pyroelectric materials are not designed to respond to radiation in this frequency range. Consequently, an additional optical absorbing layer 341 which converts the energy of the semiconductor layer 890 into heat is preferably added proximate to pyroelectric film element 340. Alternately, proelectric film element 340 may be modified to include a small percentage by volume of a material which efficiently absorbs infrared radiation at common semiconductor laser wavelengths.

However, it will be understood that the emission wavelength of conventional high power semiconductor lasers may be shifted to longer wavelengths by adding an additional wavelength conversion element that shifts the laser wavelength to longer wavelengths via an absorption and re-radiation process. Consequently, it is also possible to use a high-power long wavelength infrared radiation source at conventional pyroelectric detection wavelengths.

The pyroelectric film element is preferably a polymer which is deposited as a thin film. Preferred polymers include vinylidene fluoride polymers. One preferred polymer is polyvinylidene fluoride (PVDF), which is sold in the form of powders. It is commercially sold under the tradename KYNAR®, by Atochem North America, Inc. of Philadelphia, Pa. Copolymers of vinylidene fluoride and trifluorethylene, known under the abbreviation, VDF-TRFE may also be used as the pyroelectric film. Copolymers of VDF-TRFE can be deposited as a liquid resin. Studies by the inventors indicate the VDF-TRFE resin has materials properties consistent with the formation of a film with a thickness below 200 nanometers in thickness on a planarized surface using conventional semiconductor packaging fabrication processes. Pyroelectric films require that a poling field is applied to the film as it is cooled from a temperature initially above the Curie temperature. The poling process orientates polarized regions of the film material. Methods to apply a poling field to a polymer film are well known and need not be described.

It is desirable that the signal coupler of the present invention achieve data communication rates greater than one million bits-per second. In the present invention, the dimensions of the pyroelectric film element 340 are several orders of magnitude smaller than in conventional pyroelectric detectors. Consequently, the bulk thermal model of FIG. 2 is not applicable. The pyroelectric effect depends upon a temperature dependent change in internal dipole moment across a pyroelecric material. For small enough time scales, however, the temperature across the thickness of the film element may vary substantially, i.e., there is a finite propagation time for heat pulses through the pyroelectric material.

In the present invention, the transient response characteristics of the signal coupler is preferably calculated using a traveling heat pulse model to take into account the finite velocity of heat pulses through the signal coupler 300. Thermal pulses are generated in the resistive heater 390, travel to pyroelectric film element 340, and are dissipated to substrate 310 via thermal member 320. The flow of heat in signal coupler 300 may be modeled using the telegrapher's equation:

$$\nabla^2 T(r,t) + 1/\Lambda K[g(r,t) + \alpha/c^2 \partial g(r,t)/\partial t] = 1/c^2 \partial^2 T(r,t)/\partial^2 T \qquad \text{EQ. 1}$$

where $T(r,t)$ is the temperature at a point r, at a time t; $g(r,t)$ is the generation rate of heat at point r, and time t; c is the thermal velocity, $\alpha$ is a thermal diffusivity, and $\Lambda$ is the thermal conductivity of the material. Generally, one of ordinary skill in the art would use computer thermal modeling techniques to calculate the transmission of heat pulses through the coupler 300 in order to optimize the design of the coupler 300.

One limitation on the response rate of the signal coupler is the comparatively low thermal conductivity and thermal diffusivity of a pyroelectric film composed of common pyroelectric polymers. The thermal gradient across a thin film depends upon both its thickness and upon the thermal conductivity of the film. Generally,. thermal gradients become more severe as the thermal conductivity decreases. Additionally, the thermal velocity of heat pulses decreases as the thermal diffusivity decreases.

TABLE 1 is a table comparing the thermal conductivity and diffusivity of PVDF to a variety of other metal and insulators used in the semiconductor industry. It will be recognized that VDF-TRFE will have substantially similar thermal properties as those of PVDF. As can be seen in TABLE 1, PVDF is a thermal insulator with almost an order of magnitude lower thermal conductivity compared with silicon dioxide. PVDF has about a factor of 1500 lower thermal conductivity and thermal diffusivity compared to a silicon substrate. Many common metals, such as gold, have over a factor of 2000higher thermal diffusivity compared with PVDF. Material Thermal Conductivity Thermal Diffusivity

TABLE 1

Comparison of Thermal Properties.

| Material | Thermal Conductivity | Thermal Diffusivity |
| --- | --- | --- |
| PVDF | 0.1–0.13 W/mK | $0.06 \times 10^{-6}$ m$^2$/sec |
| Silicon Dioxide | 1.38 W/mK | $0.83 \times 10^{-6}$ m$^2$/sec |
| Silicon Nitride | 16 W/mK | $9.65 \times 10^{-6}$ m$^2$/sec |
| Aluminum nitride | 230 W/mK | $76 \times 10^{-6}$ m$^2$/sec |
| Silicon | 150W/mK | $89.2 \times 10^{-6}$ m$^2$/sec |
| Silicon Carbide | 220 W/mK | $103 \times 10^{-6}$ m$^2$/sec |
| Copper | 400 W/mK | $117 \times 10^{-6}$ m$^2$/sec |
| Gold | 317 W/mK | $127 \times 10^{-6}$ m$^2$/sec |
| Diamond | 2300 W/mK | $1300 \times 10^{-6}$ m$^2$/sec |

The low thermal diffusivity of PVDF and VDF-TRFE will cause heat pulses to propagate at a low velocity through a polymer pyroelectric film. Additionally, the low thermal conductivity of the polymer pyroelectric film will tend to result in large thermal gradients across the thickness of the polymer film. Both of these effects are undesirable, since they will tend to reduce the sensitivity of the pyroelectric film, particularly at high modulation rates.

One way to reduce the time for heat pulses to propagate through a PVDF film is to reduce the thickness of the PVDF film. Consequently, a preferred polymer pyroelectric film thickness is less than two microns. It is desirable to fabricate the polymer film as thin as practical. A polymer pyroelectric film thickness of 200 nanometers or less is practical with current technology. A film thickness of 100 nanometers is consistent with a spin casting process since other thin resins and polymers (e.g., photoresist) are routinely deposited in this manner. Utilizing an extremely thin polymer pyroelectric film reduces the time required for heat pulses to propagate through the pyroelectric film element 340 by a factor in the range of about 10 to 100 compared to prior art pyroelectric detectors which commonly use PVDF films which are 2 to 20 microns thick. Additionally, reducing the film thickness decreases thermal gradients across the thickness of the film by a corresponding factor.

Moreover, the inventors have recognized that the thermal response of the PVDF (or VDF-TRFE) film can be improved by another factor in the range of about 10 to 100 by adding a significant percentage of an electrically non-conducting material with a high thermal conductivity and a high thermal diffusivity. Suitable additives include powders such as beryllia, alumina, diamond, and alumina-nitride. The particle size of the powder must be less than the desired film thickness (e.g., for a 200 nanometer polymer film an alumina nitride powder should have a mean particle size less than 200 nanometers). Preferably, the particles size is substantially less than the desired film thickness. In a first order approximation, the thermal conductivity of a polymer impregnated with fine particles of a thermally conductive material will be the average of the two materials, weighted by their relative volume. As an example, alumina nitride has a thermal diffusivity of $76 \times 10^{-6}$ m$^2$/sec, which is approximately a factor of 1270 greater than that of PVDF. Adding about 1% by volume of alumina nitride powder to the resin increases the average thermal conductivity by a factor greater than 12 whereas adding 10–20% by volume of alumina nitride powder to the resin used to form a PVDF film will increase the average thermal diffusivity of the modified PVDF film by a factor in the range of about 120–250 depending upon the exact composition selected. Similarly, adding about 1% by volume of diamond powder to a PVDF film will increase the average thermal diffusivity by a factor of greater than 200 compared to PVDF alone.

Another limitation to the response rate of the signal coupler is the thermal mass of the pyroelectric element. Pyroelectric film detectors respond to differential increases in temperature. In order to detect thermal pulses without deleteriously overheating, pyroelectric film detector element 340 must rise rapidly in temperature in response to an incoming thermal pulse and rapidly decrease in temperature at the cessation of the thermal pulse, i.e., return to a baseline operating temperature range. A transient thermal model is also preferably used to calculate the heating and cooling rate of the pyroelectric film element 340. However, to a first order approximation the heating and cooling rate will depend upon the thermal mass of the pyroelectric film element. The thermal mass (sometimes also known as the thermal capacity or thermal capacitance) of pyroelectric element 340 is preferably minimized by reducing its area and thickness, since this facilitates a small pulse of thermal energy rapidly raising the temperature of pyroelectric element 340 and also enables the pyroelectric film element 340 to rapidly cool after the cessation of a thermal pulse. Consequently, it is desirable that the pyroelectric film element 340 has a thickness less than about 200 nanometers and a diameter less than about 100 microns. A preferred design is a pyroelectric film thickness of 200 nanometers and a film diameter of 100 microns. A film thickness of 100 nanometers and a film diameter of 50 microns is expected to give the best performance results, although a film thickness of 100 nanometers may result in a lower yield spin casting fabrication process.

Figure 9A:
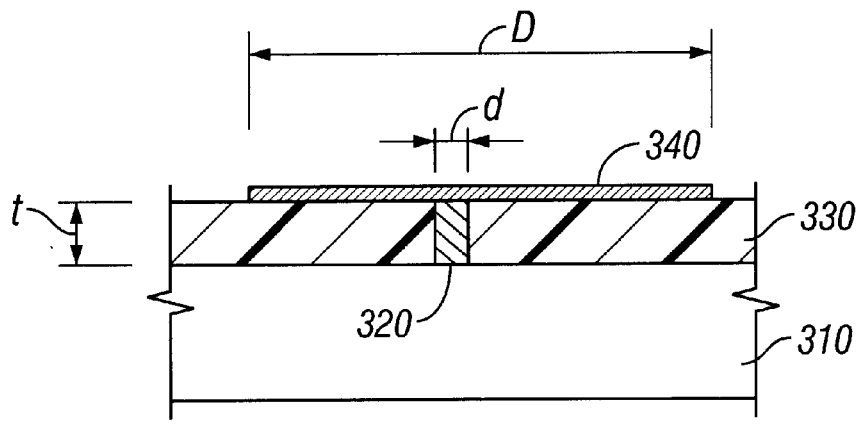
FIGS. 9A–9C are illustrative side views showing how the thermal members of FIGS. 3, 4, and 8 may be shaped to regulate the flow of heat.
Figure 9B:
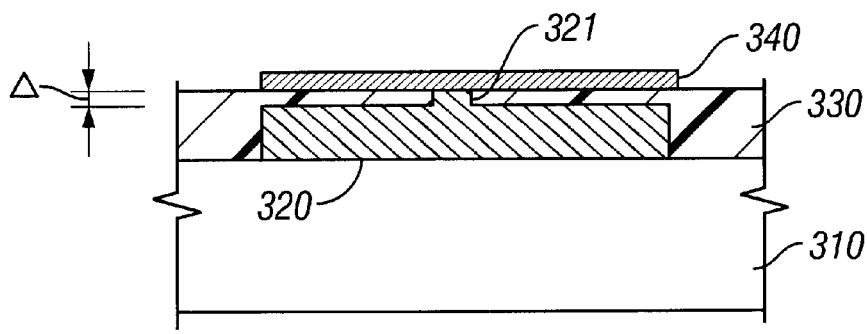
Figure 9C:
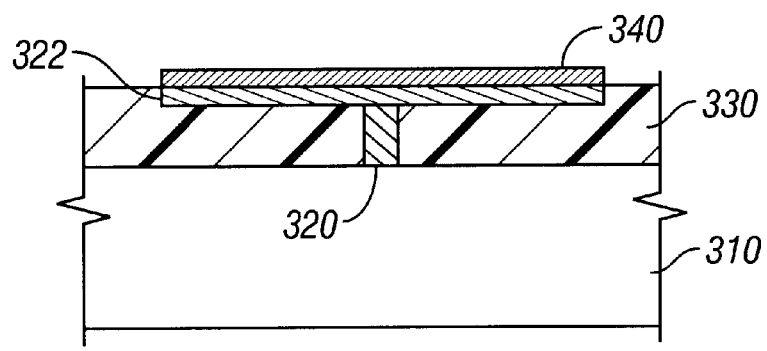

Still another limitation to the response rate of the signal coupler is the flow of heat from the pyroelectric film element 340 to the heat sink via thermal member 320. The pyroelectric film element 340 preferably rapidly cools to a substantially uniform baseline operating temperature at the cessation of a thermal pulse. The inventors have recognized that thermal member 320 is preferably designed to optimize both steady state and transient heat flow from pyroelectric film element 340 to substrate 310. FIGS. 9A–9C are illustrative figures showing ways in which thermal member 320 may be shaped in different ways to regulate the flow of heat pyroelectric film element 340. For the purposes of illustration, some layers of the completed receiving section 304 are not shown in FIGS. 9A–9C.

FIG. 9A shows a first embodiment of a thermal member 320. Thermal member 320 has a diameter δ which is different than that of pyroelectric film element 340. The flow of heat out from pyroelectric element 340 may be regulated by varying the thickness, t, of support layer 330, the composition of support layer 330 and thermal member 320. and the diameter δ. FIG. 9B shows a second embodiment of thermal member 320 in which thermal member has a narrow neck 321 and a broader base, which will alter the thermal characteristics of thermal member 320. FIG. 9C shows an embodiment of a T-shaped thermal member 320 which has a thermally conductive region 322 proximate pyroelectric element 340 to reduce transverse thermal gradients across pyroelectric film element 340.

Thermal member 340 performs the function of a thermal valve in which there is a finite transit time of heat through the valve and in which the physical characteristics of the valve determine the rate which heat flows through the valve to the heat sink. By selecting the shape, length, cross-sectional area, thermal diffusivity, and relative area of thermal member 320 to pyroelectric film element 340 the average and transient flow of heat through thermal member 320 may be regulated. The optimum shape of thermal member 340 will depend upon the relative time scale and upon the temperature distribution across the pyroelectric film element 340 after the cessation of a thermal pulse. This will depend partially on the transverse temperature profile of thermal pulses generated by the resistive microheater 390. As one example, a thermal pulse may have a two-dimensional temperature profile which is peaked at the center of the pyroelectric detector element. Consequently, the embodiment of FIG. 9A may be desirable to optimize the transient flow of heat, since it has stronger thermal coupling at the center of the detector. However, the thermal pulse may also have a substantially uniform two-dimensional profile across the pyroelectric detector film element. Consequently, the embodiment of FIG. 9C may be preferable to uniformly cool the pyroelectric film element 340.

Data may be transmitted via signal coupler 300 using several different encoding means consistent with the nature of pyroelectric detectors. This include several well known pulse code modulation schemes, such as simple pulse code modulation (PCM) in which digital one' and zero' are represented by the presence or absence of thermal pulses. Additional pulse-shaping circuitry is desirable to convert the output of the pyroelectric detector into well-defined digital ones and zeros. The detector and digital circuit art is full of many different circuits to convert a signal which is correlated to an input data pulse into a well defined digital output. Generally. one of ordinary skill in the art would preferably configure one of these conventional circuits to convert the pyrolectric current associated with the rise of temperature of pyroelectric film element 340 into sharp, well-defined digital pulses. However, digital pulse shaping circuits are not part of the present invention.

Alternately, data may be encoded by transmitting pulses of a constant duty cycle but with a variable frequency wherein the variable frequency. is used to transmit data (e.g., frequency shift keying). This has the disadvantage of requiring more complicated circuitry to encode and decode the data signals but has the advantage that the average heat flow is constant, which simplifies the thermal design.

The maximum data rate of signal coupler 300 may be approximated by calculating the thermal response time of the pyroelectric film element and electrodes for a particular design and estimating the corresponding pyroelectric signal strength to ensure that the signal is above a preferred threshold level for detection. Calculations by the inventor for a receiving section 304 with a 100 nanometer thick polymer pyroelectric film element 340 with a pad diameter of about 50 microns indicate that a thermal transient response time of 0.33 nanoseconds may be achieved by adding 10–20% by weight of alumina nitride. Electrodes 350, 360 add about 0.2 nanoseconds to the response time, for a thermal transient response time of about 0.5 nanoseconds. As is well known, the transmission of resolvable digital bits is limited to a rate at least about a factor of 2–3 lower than the transient response time constant. It is also desirable to select the pulse width of each bit to be a fraction (e.g., less than half) of the clock period to facilitate the pyroelectric film element 340 cooling to a baseline operating temperature after receiving each thermal pulse. The inventors' calculations indicate that a data transmission rate substantially in excess of one million bits per second may be achieved in the signal coupler 300 of the present invention, with five hundred million bits per second constituting a conservative upper limit with current technology. Further improvements in polymer pyroelectric materials may enable even higher data rates in excess of one gigabit per second. This makes the signal coupler of the present invention attractive for many signal coupling applications where a removable high data rate signal coupler is desirable.

Several variations of the present invention are within the scope of the present invention. Referring to FIG. 1B, in some cases it may be desirable to utilize a second pyroelectric detector, spaced apart from the sensing pyroelectric detector, in order to provide a reference signal which is differentially subtracted in order to compensate for local environmental temperature changes unrelated to the propagation of signals.

While FIGS. 3–9 show a signal coupler comprising two substrates, the substrates may each be sections of a larger unit. One possible use of the signal coupler of the present invention is to couple signals to a hermetically sealed package for which it is impractical or inconvenient to form permanent solder bonds. This may occur because of the fragility of the hermetically sealed package or it may be impractical to form permanent solder bonds for other reasons, such as the temperature of the bonding process having a deleterious effect on the components enclosed in the hermetically sealed package. As an illustrative example, a portion of the hermetically sealed package may have a surface comprising a substrate portion having a pyroelectric detector element and/or a micro-heater constructed according to the teachings of the present invention. A second substrate portion containing corresponding signal coupling elements would then be thermally coupled to the first substrate portion via a layer of thermal grease.

Although a preferred embodiment of the present invention and modifications thereof have been described in detail herein, it is to be understood that this invention is not limited to those precise embodiments and modifications, and that other modifications and variations may be affected by one of ordinary skill in the art without departing from the spirit and scope of the invention as defined in the appended claims.

What is claimed is:

1. A signal coupler for communicating digital signals, comprising:
   a) a receiving section, including:
      i) a first thermally conductive substrate;
      ii) a thermally and electrically insulating support layer attached to a surface of said substrate;
      iii) a pyroelectric film element disposed on the outer surface of said support layer, said pyroelectric film element having first and second opposed film surfaces;
      iv) a thermally conductive member disposed in said support layer thermally coupling said pyroelectric film element to said substrate, said thermal member shaped to regulate the transient flow of heat away from said pyroelectric film element to said first substrate; and
      v) first and second electrical contacts coupled to said pyroelectric film element configured to couple an electrical output signal from said pyroelectric film element; and
   b) a transmitting section, including:
      i) a second substrate; and
      ii) an energy source disposed proximate the surface of said second substrate configured to generate thermal pulses in said pyroelectric film element.

2. The signal coupler of claim 1, wherein said pyroelectric film element is composed of a pyroelectric polymer including a greater than about 1% by volume of a high thermal diffusivity material so that said pyroelectric film element has a thermal diffusivity at least ten times greater than the thermal diffusivity of the bulk polymer.

3. The signal coupler of claim 2, wherein said energy source comprises a thin film resistive heater having electrical contacts configured to supply a drive current to said heater.

4. The signal coupler of claim 3, wherein said transmitting section is thermally coupled to said receiving section by a thermally conductive film.

5. The signal coupler of claim 4, wherein said thermally conductive film is a film of thermal grease.

6. The signal coupler of claim 4, wherein said second substrate comprises a thermally conducting substrate with a thermally insulating region disposed proximate said thin film resistive heater, said thermally insulating region configured to reduce the flow of heat from said heater into said thermally conducting substrate.

7. The signal coupler of claim 5, wherein said pyroelectric film element has a diameter less than about 100 microns and a thickness less than about 200 nanometers.

8. The signal coupler of claim 6, wherein said pyroelectric polymer includes at least a 10% by volume of a high thermal diffusivity material so that said polymer has a thermal diffusivity at least 100 times greater than the thermal diffusivity of the bulk pyroelectric polymer.

9. The signal coupler of claim 7, wherein said high thermal diffusivity material is selected from the group consisting of: beryllia, alumina, diamond, and alumina-nitride.

10. The signal coupler of claim 1, wherein said energy source comprises a semiconductor laser.

11. The signal coupler of claim 10, wherein said semiconductor laser has an emission wavelength in the range of 0.6 to 1.8 microns and wherein the signal coupler further comprises an infrared absorbing layer coupled to said pyroelectric film selected to absorb infrared radiation emitted from said semiconductor laser source.

12. A multi-channel signal coupler, comprising:
    a) a first thermally conductive substrate, including:
        i) a first thermally insulating support layer disposed on the surface of said first thermally conductive substrate;
        ii) a first pyroelectric film element disposed proximate the surface c-of said first support layer and configured with electrical contacts to form a first pyroelectric detector;
        iii) a first thermal member disposed in said first support layer between said first pyroelectric film element and said first thermally conductive substrate configured to regulated the flow of heat away from said first pyroelectric film element to said first thermally conductive substrate; and
        iv) a first thin film resistive heater disposed proximate the surface of said first support layer and spaced apart from said first pyroelectric detector, said first resistive heater having electrical contacts configured to enable electrical current to be pulsed through said first thin film heater; and
    b) a second thermally conductive substrate, including:
        i) a second thermally insulating support layer disposed on the surface of said second thermally conductive substrate;
        ii) a second pyroelectric film element disposed proximate the surface of said second support layer and configured with electrical contacts to form a second pyroelectric detector;
        iii) a second thermal member disposed in said second support layer between said second pyroelectric film element and said second thermally conductive substrate configured to regulate the flow of heat away from said second pyroelectric film element to said second thermally conductive substrate; and
        iv) a second thin film resistive heater disposed proximate the surface of said second support layer and spaced apart from said second pyroelectric detector, said second resistive heater having electrical contacts configured to enable electrical current to be pulsed through said second thin film heater;
    wherein in the assembled signal coupler a thermally conductive film thermally couples said first and said second substrate to form a plurality of data communication channels, each said data communication channel including one of said pyroelectric detectors and one of said resistive heaters disposed in opposed portions of said first and second substrates.

13. The signal coupler of claim 12, wherein said thermally conductive film is thermal grease.

14. A method of communicating data signals, comprising the steps of:
    a) providing a receiving section having a first substrate with a thin film pyroelectric detector element;
    b) providing a transmitting section having a second substrate with a micro-heater configured to generate thermal pulses in response to an input electrical signal;
    c) thermally coupling the micro-heater of the second substrate to the pyroelectric detector of the first substrate with a thermally conductive film disposed between said receiving and transmitting sections;
    d) generating thermal pulses in the micro-heater; and
    e) detecting a pyroelectric signal in said pyroelectric detector.

15. The method of claim 14, wherein said thermally conductive film is thermal grease.

* * * * *